United States Patent [19]

Nagel et al.

[11] 4,038,677
[45] July 26, 1977

[54] COMPOSITE SEMICONDUCTOR UNIT AND METHOD

[75] Inventors: Karl Nagel, Gomaringen; Gerhard Conzelmann, Leinfelden; Horst Gschwendtner, Esslingen, all of Germany

[73] Assignee: Robert Bosch G.m.b.H., Stuttgart, Germany

[21] Appl. No.: 548,068

[22] Filed: Feb. 7, 1975

[30] Foreign Application Priority Data

Feb. 22, 1974 Germany .............................. 2408540

[51] Int. Cl.$^2$ ...................... H01L 27/02; H01L 29/06
[52] U.S. Cl. .......................................... 357/51; 357/40; 357/55
[58] Field of Search ............................. 357/51, 55, 40

[56] References Cited
U.S. PATENT DOCUMENTS 3,930,304   1/1976   Keller et al. ............................ 357/51

Primary Examiner—Edward J. Wojciechowicz
Attorney, Agent, or Firm—William R. Woodward

[57] ABSTRACT

To detect defective elements in a composite semiconductor unit, such as a plurality of transistors, diodes, or the like, connected together to provide desired output levels, the elements are arranged in the unit, for example by providing coupling resistors, or melt positions in the connections to the respective units so that defective elements in the unit can be recognized and isolated from the remaining, non-defective elements in the unit, so that, overall, a semiconductor unit results which is operative and from which defective sub-elements have been, electrically, removed. The defective elements are recognized by applying a voltage to an electrode pair which is below the normal breakdown voltage between the pair of electrodes, then determining the total blocked current flow to the unit and, if the blocked current flow is not at design level, individually measuring the electrical characteristics of the elements until the defective element is identified, whereupon a current pulse is applied thereto in order to electrically isolate the specific element from the unit.

24 Claims, 12 Drawing Figures

COMPOSITE SEMICONDUCTOR UNIT AND METHOD

CROSS REFERENCE TO RELATED APPLICATION

Ser. No. 539,441 filed Jan. 8, 1975 claiming German Priority: p 24 01 701.4, CONZELMANN et al.

The present invention relates to a composite semiconductor unit which comprises at least two, and preferably a comparatively large number of similar, or approximately similar sub-elements; looked at from another point of view, the semiconductor unit has what may be termed a topological structure, that is, it is composed of a set of essentially similar elements.

Composite semiconductor elements which are to be used for high current, such as high-current diodes, or transistors, are frequently constructed by building a plurality of $n$ similar cells, or units, each one of which is designed to carry one nth portion of the entire current. Such structures are used particularly in monolithic integrated circuit technology.

As the surface of a semiconductor unit is increased, the probability that small elemental areas in the crystal chip have disturbances or defects therein is increased. These defective elemental areas may be extremely small; due to the electrical connection of the various semiconductor elements in the composite unit, however, a defect in any one of the elements causes rejection of the entire unit. As a result, as the single crystal chip surface increases, the yield of composite units rapidly decreases when actual production of the units is considered. This, then, unduly increases the manufacturing costs, which rise rapidly as the crystal surface increases, and non-linearly, with a high rate. Semiconductor units which are composed of twenty or more similar cells or elements have been constructed. Crystal defects may affect only a single one of these cells or elements but, nevertheless, the entire unit becomes useless and must be rejected.

It is an object of the present invention to so construct semiconductor units that the high reject rate due to defects in the crystal, or crystal structure, or manufacture, will not result in rejection of the entire unit.

Subject matter of the present invention: Briefly, the semiconductor unit is so arranged that defective elements, or portions thereof, can be detected and the particular element then can be isolated from the remaining, non-defective elements of the units.

In accordance with a feature of the invention, resistors located in at least one of the electrode connection lines to any one of the units are so arranged that voltages across the terminals of the resistors can be measured, in order to detect and then isolate an element from the entire unit. The resistors and electrode connection lines frequently do not require any specific, additional constructional or preparation costs since these resistors are often provided already to stabilize and equalize the current distribution between the various elements of the units. The defective elements can be isolated and separated from the remaining elements of the units by severing a connecting portion of the metallic connecting network which interconnects the various elements of the units.

The invention is further directed to a method to isolate defective elements of units, and in accordance with this feature of the invention, defective elements are first, by measuring techniques, identified. The so identified defective element is then electrically severed from the remaining elements of the units by means of a current pulse. To provide contacts for meter probes to connect pulses, and the like, and in accordance with a feature of the invention, the circuit is provided with lands which, simultaneously, may supply contact surfaces for the severing current pulse, which is so energized that the connecting lines are burned off upon application of electrical energy. The lands, and fusible links, or melt bridges, can be arranged over the active crystal zones so that additional crystal surface is hardly needed.

A semiconductor composite unit, in accordance with the invention, and to be tested by the process in accordance with the invention, is preferably so dimensioned that it can be made within the usual tolerance limits of manufacture and permit severing of up to about 20% of the cells or elements of the composite unit, without deterioration of currentcarrying capacity, or other characteristics, beyond design specifications.

Melting bridges, or fusible links, in one or more of the electrode connections may, of course, be so located that specific defects which later arise in initially "good" or operative units will, subsequently, sever themselves when in operation, in that the current through these fusible links becomes too great. The arrangement of the fusible links can then be so placed that the entire unit is self-healing, or self-correcting. The invention will be described by way of example with reference to the accompanying drawings, wherein:

FIG. 4b is the equivalent circuit diagram, including the defect, of the transistor cell of FIG. 4a;

Figure 1:
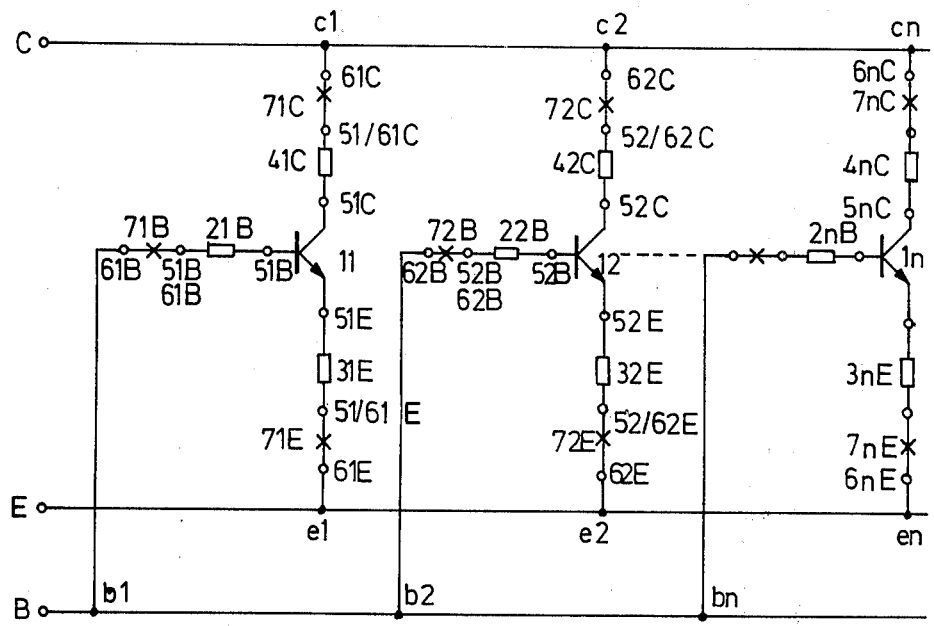
FIG. 1 is a schematic circuit arrangement illustrating connection of various cells to a multi-cell, or multi-element composite transistor unit, and having measuring resistors and fusible links in the connecting lines.
Figure 2:
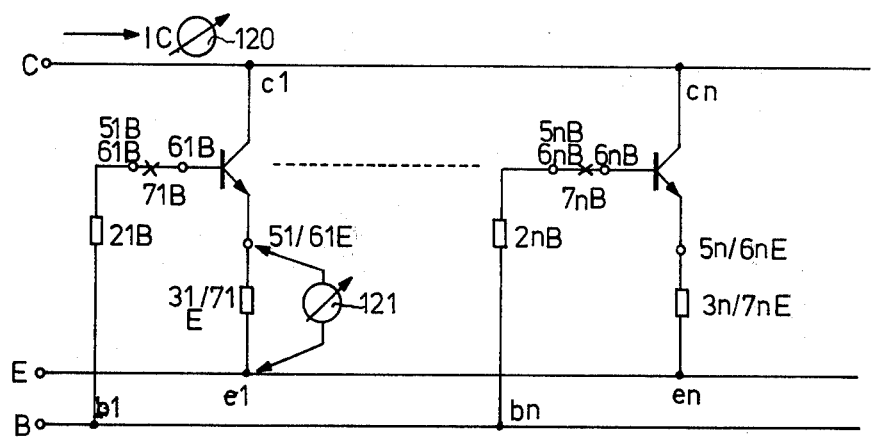
FIG. 2 is a schematic circuit diagram of a plurality of cells or elements of a multi-cell transistor, and having measuring resistors in the base and emitter connections, the measuring resistors in the emitter connections simultaneously functioning as balancing resistors to stabilize current distribution among the transistor cells, and additionally functioning as fusible links.
Figure 3:
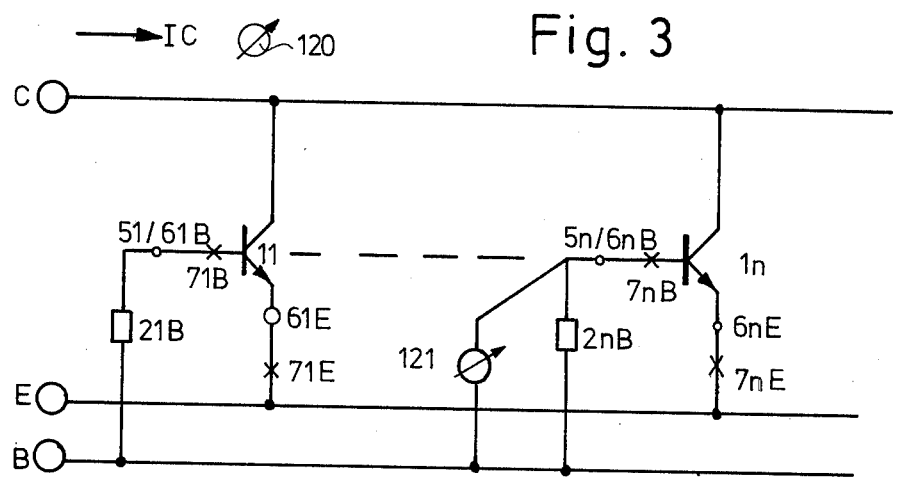
FIG. 3 is a schematic diagram illustrating simplification of the common connection of various cells to a multi-cell transistor unit, in which measuring resistors are located only in the base lines, and fusible links are located in the base and emitter lines, the resistance of the fusible link in the emitter line being capable of additionally functioning as a measurement resistor.
Figure 4A:
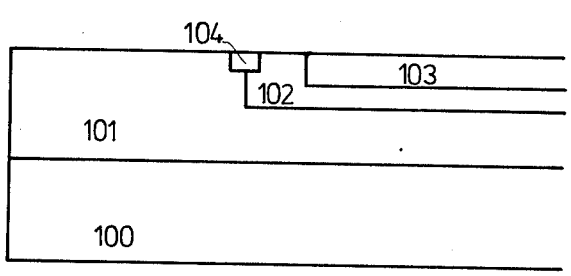
FIG. 4a is a fragmentary schematic cross-sectional view through the structure of a transistor cell, having a defect therein.
Figure 4B:
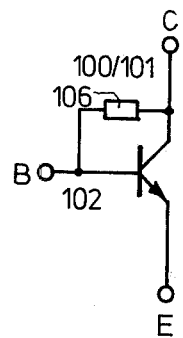
Figure 5A:
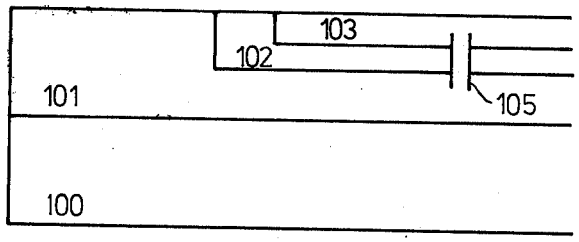
Figure 5B:
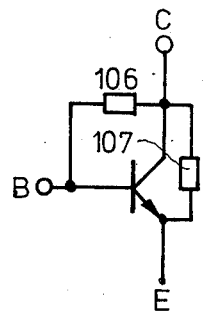
Figure 6A:
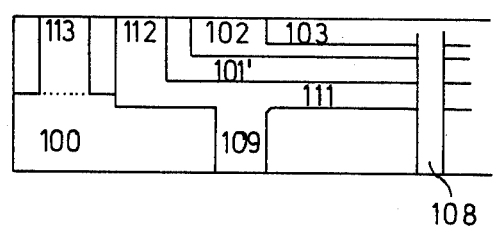
Figure 6B:
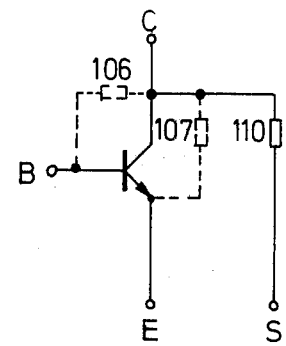
Figure 7:
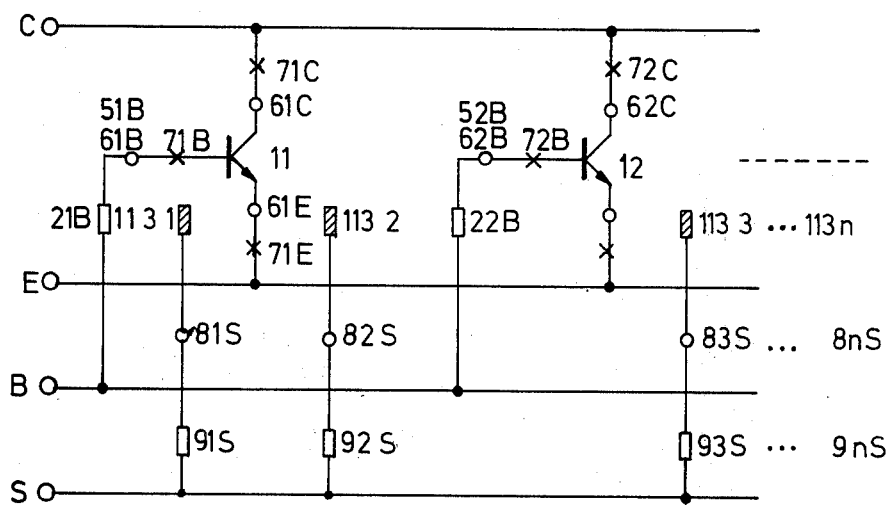
Figure 8A:
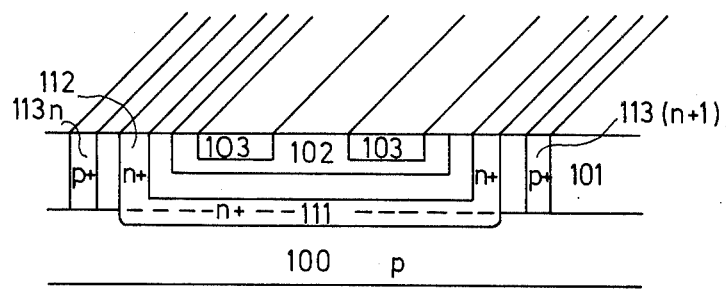
Figure 8B:
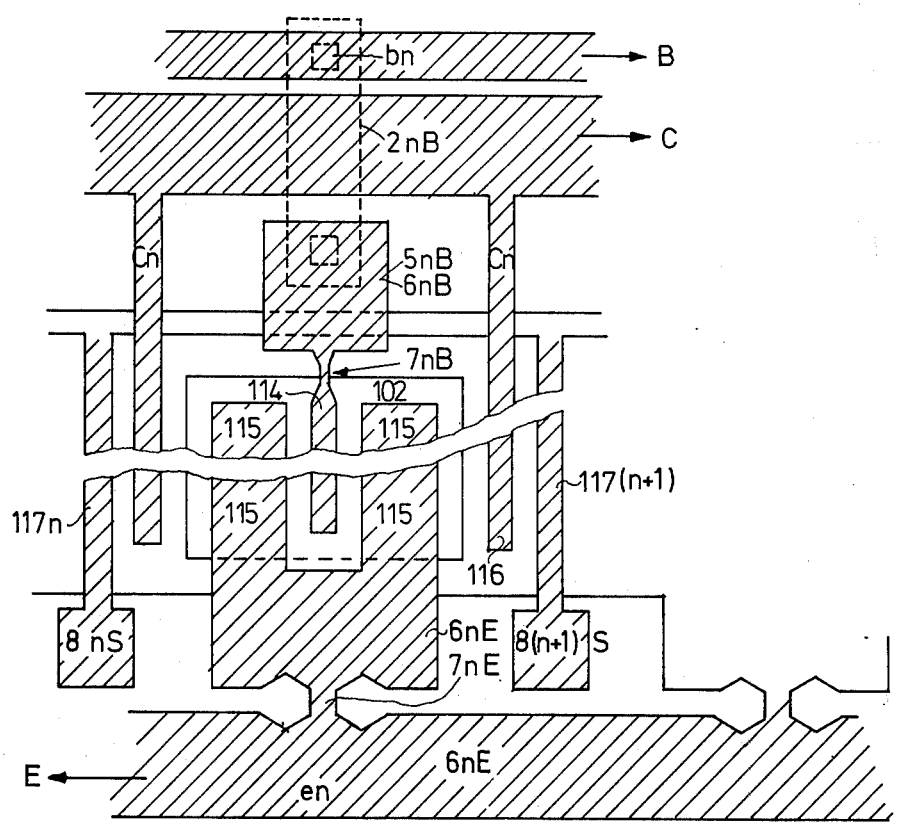

FIG. 5a and 5b correspond, respectively, to FIGS. 4a and 4b, and show a different defect;

FIGS. 6a and 6b correspond, respectively, to FIGS. 4a and 4b and show yet another defect, as applied to a cell in a monolithic integrated structure, in which two defects which arise only in monolithic integrated structures are illustrated;

FIG. 7 is a schematic circuit diagram showing the connection of various cells in a multi-cell transistor in the monolithic integrated structure of FIG. 6, and further showing the arrangement of measuring resistors in the base connection, the arrangement of fusible links, and of test points;

FIG. 8a is a partly perspective, partly cross-sectional view through a cell in a monolithic integrated structure, also showing lands for connection of test probes, and to apply current severing pulses to sever fusible links; and FIG. 8b is a top view of the cell of FIG. 8a. Before considering the drawings in detail, the nomenclature and numbering of the elements to employed will be defined, with reference to FIG. 1. C, E and B are the collector, emitter, and base connections, respectively, connected to the outside of the unit. 11, 12, . . . 1n are the elementary transistor elements, or cells, of the unit. 21B, 22B . . . 2nB are measuring resistors in the base lines; 31E, 32E . . . 3nE are measuring resistors in the emitter lines; 41C, 42C . . . 4nC are measuring resistors in the individual collector lines from the cells; 71B, 72B . . . 7nB; 71E, 72E . . . 7nE; and 71C, 72C . . . 7nC are, respectively, fusible links, or melt bridges in the respective base, emitter and collector lines from the individual transistor cells. The test probe points to pick up measuring potentials are indicated at 51B . . . 5nB; 51E . . . 5nE; and 51C . . . 5nC. The connecting points to apply a current pulse to fuse the fusible links, that is, to burn off or sever the melt bridges having the prefex 7 are indicated at 61B, 62B . . . 6nB; 6nE and 6nC. The connecting points to the buses of the electrodes B, E, C are indicated at bn, en, cn. The example selected to illustrate the invention, the measuring resistors and the severing points is that of a transistor structure; the measuring resistors and the severing points are purely formally located in each one of the electrode lines, to be associated with each electrode. In discrete power transistors, in which all the collectors are connected together directly through the substrate, the measuring resistors and the severing points cannot be separately identified. FIG. 1 is, therefore, intended to be illustrative, and schematic, shown in detail for purposes of explaining the present invention although, in practical execution not all of the measuring points, measuring resistors, or fusible links will, or need, actually be used. In the subsequent Figures, similar elements have been given the same reference numerals and will not be described again A practical example is illustrated in FIG. 2. A current-measuring instrument, ammeter 120, is suitably connected in the line C to measure the collector current IC of the unit. A measuring instrument, such as a Volt meter 121, is provided connected, for example, as shown in FIG. 2, across the resistor 31E, or the fusible link 71E. The Volt meter is also available to determine voltage drop across any of the other measuring resistors, such as the resistors 2nB, 3nE, or the like. The emitter resistors 3nE may be used at the same time to stabilize and balance the current distribution to the various transistor elements. They may be made as vapor deposited chrome-nickel resistors which, simultaneously, serve as fusible links 7nE. Conversely, the fusible links 7nE may be made as narrowed, necked-down portions of the customary metallizing network forming the metallic connectors, and these necked-down portions of reduced area then can function as measuring resistors 3nE. Separate, special emitter resistors are, therefore, not necessarily required. If the current distribution in the entire transistor unit is balanced and properly allocated without emitter resistors, then the emitter resistors as such can be omitted. As indicated in FIG. 3, only the fusible links 7nE are required. No further current-limiting resistor would be connected, in this case, between the base connection bn and the emitter connection en, other than the resistor 2nB. To fuse, that is, to interrupt the metallic connection of the fusible link 7nB in advance of the base, only a single land 5nB is required. The fusing current flows from the land 5nB over the fusible link 7nB through the base-emitter diode, as well as over the fusible link 7nE, and back to the emitter main line or bus. Thus, the requirements for circuit components, and special connecting lines, are substantially reduced. In preparing the test sequence, which may be in form of a test program, attention need merely to be paid to the fact that the fusible link 7nB in the base line fuses before the fusible link 7nE in the emitter melts off.

A schematic cross-sectional view through the structure of a cell or element is shown in FIG. 4a, in which the substrate 100 has an epitaxial layer 101 of the same conductivity type applied thereto. The base of the transistor unit is shown at 102, and the emitter at 103. A defect is schematically illustrated at 104. The equivalent circuit of the defect is shown at 106 in FIG. 4b, and may be composed, for example, of a resistance 106' and a diode 106''. Depending on the nature of the defect, the diode 106'' may have the equivalent resistance 106' connected in parallel (as shown in FIG. 4b) or in series. The diode component 106'' may also be absent entirely, depending on the nature of the defect which may have purely ohmic character, or have, at least in part, the characteristics of a junction. If a sufficiently high blocking voltage is applied between the collector and base of the transistor, then current will flow from the collector to the base over the defect circuit, and then continue in the base line over the resistor 2nB. The defect can, therefore, be determined by measuring the voltage drop across the resistor 2nB. The blocking voltage to be applied between the collector and base should, of course, always be below the normal breakdown voltage between the collector and the base, so that, to test the units, no destruction, or additional defects are introduced by the test proceedings.

A different type of defect is illustrated in FIG. 5a, in which defect 105 effects a direct connection between emitter and collector of the transistor element or cell. In addition to the shunt path 106, a further shunt between collector and emitter, and having the equivalent circuit 107, is provided. Usually, the resistance of the shunt path 107 has low resistance. A defect of this type, resulting in both shunt paths 105, 106, can easily be detected by means of the emitter resistor 3nE which, as previously noted, may be formed as fusible link, or fusible strip. If the collector-emitter voltage is sufficiently high, then this defect may also be detected by measuring the voltage drop across the base resistor 2nB. The resistor path 107 of the defect may be of very low resistance and, therefore, it is desirable to apply only very short voltage pulses, and to carry out the measurement during the occurrence of the short pulse, and then to hold the measuring results.

A multi-cell transistor in a monolithic integrated structure is illustrated in FIG. 6a, in which, again, the substrate is shown at 100, and the epitaxial layer at 101' now doped with opposite polarity. 102, and 103, are the base, and emitter, respectively. A low-resistance collector contact is provided, as usual, by a highly doped buried layer 111, which frequently connects to a highly doped connecting diffusion layer 112. The connection diffusion layer, or strip 112 permits a low-resistance connection of a surface collector terminal to the buried layer 111. Such structures may have various types of defects, that is, not only the defects 104, 105, but also additional defects such as the defect 108, FIG. 6a, which extends from the emitter through to the substrate contact, or a defect 109 which is a connection between the buried layer 111 and the substrate 100. The corresponding, equivalent circuit as seen in FIG. 6b, therefore, illustrates an additional bypass or shunt 110, extending from the collector C to the substrate S. Defects 106, 107 are shown in dashed lines, for clarity, and correspond to the similar defects, previously discussed. The various defects illustrated in the equivalent circuit of FIG. 6b can be detected if each one of the separate cells or elements is electrically insulated from the remainder of the integrated structure; this is a customary arrangement, in which a customary insulation diffusion 113 separates the various elements, or cells from each other. The current flowing to the substrate raises the voltage of the substrate in the immediate vicinity of the defect. If, for example, the insulation diffusion 113 in the region located between the various cells is formed on the surface with a metallization 117 (see FIG. 8b), which is provided with connecting lands, then the defect can be detected by measuring the voltage difference between metallizations 117n and 117n + 1.

Interconnection of cells, or elements of a semiconductor unit in an exemplary form is shown in FIG. 7. The isolation diffusion 113 1, 113 2, 113 3 . . . 113n and the associated connecting lands 81S, 82S, 83S . . . 8nS, as well as the substrate resistances 91S, 92S, 93S . . . 9nS are likewise shown.

If, as in FIGS. 6, 7 and 8, the various cells are isolated from each other, then all possible defects can be separately detected, and the defective cells can be severed from "good" cells. The fusible links or strips 7nC are then used, located in the collector lines. The fusible links 7nE in the emitter lines are not needed. If base resistors 2nB, connected in the base lines, are of sufficiently high resistance, then the fusible links 7nB in the base lines may also be omitted. Since, however, insulation and isolation of the respective cells or elements with respect to each other by an isolating diffusion 113n require a comparatively great amount of space, detection of defects 108, 109 might be omitted, since such defects are comparatively rare in comparison to the defects 104, 105, FIGS. 4a, 5a. If omission of these tests are comparatively rarely occurring defects is tolerable under production conditions, then the cells or elements of the circuit of FIG. 3 can be interconnected also when using monolithic, integrated technology.

FIG. 8, taken collectively as FIG. 8a and FIG. 8b, illustrates a cross section and fragmentary perspective view (FIG. 8a) and a layout (FIG. 8b) of a cell isolated from remaining cells. Besides the elements previously described, the base resistor 2nB is formed with a contact window bn; the metallization 114 of the base connection contact is shown; 115 is the emitter terminal, and 116 is the collector terminal. 117n, and 117n + 1 are, respectively, the metallizations of the insulating diffusion between the various cells which are connected at one end with a respective land 8nS or 8(n + 1)S, to measure the respective voltage differences. Fusible links or bridges and associated lands in the collector lines were omitted in the example illustrated.

The defective cells or elements of a set of cells in a semiconductor unit are detected upon preliminary measurement of the various circuits. A specific test sequence, which may be incorporated in an automatic test program, will be described in connection with FIG. 3, as a non-limiting example.

Testing cells or elements for defects, with reference to FIG. 3: Emitter terminal E is first connected to the base terminal B. The collector operating voltage $U_{CB}$ is then connected between the collector terminal C and the common junction forming the connection of E and B. If the collector current $I_C$, as determined by ammeter 120, is within the design limit, that is, is below a predetermined limiting threshold value, then the entire set of cells, or the entire unit is in order. No further testing for defects is necessary, and checking individual cells is not required.

If the collector current $I_C$ measured by instrument 120 is excessive, however, then the defective cell must be found. In subsequent testing steps (which may be automatically stepped by a testing program), the voltage across the base resistors 2nB is sequentially determined for the various cells by measuring the voltage with Volt meter 121, as illustrated in the connection of FIG. 3, right-hand transistor element. When the first defective cell x has been found then, as a next step, a current pulse is applied due to which, first the fusible link or bridge 7XB in the base connection is severed, and thereafter the fusible link 7XE in the emitter line - with respect to the cell X. This specific cell or element is thus severed from the remainder of the set of cells. Collector current $I_C$ for the remaining unit is then checked again. If it is within the tolerance limit, then the unit has now been corrected, and the defective cell found and isolated, and testing for further defective cells can be terminated. If the current through meter 120 is still too high, however, then further cells have to be checked, as before described, and, when further defective cells have been found, these additional defective cells are severed, as above described.

If a cell is supplied with more than one resistor to determine defects, then the condition of this cell is determined by the voltage difference of all the resistors. By means of a Volt meter 121, the voltages across the resistances of any one cell can, therefore, be tested sequentially. In order to accelerate the testing time, however, a plurality of Volt meters may be applied simultaneously, to make concurrent voltage measurements. It is also possible to measure the voltage drop by means of a plurality of measuring devices across each one of a plurality of similar resistors of a cell - and, under some conditions, a sufficient number of Volt meters may be used to measure the voltage drop across all cells, in parallel and, by means of more than one current pulsing device, to sever more than one fusible link or bridge. If more than one Volt meter is used, the voltage checking may, of course, then be interrupted as soon as all the defective cells have been detected.

If the semiconductor unit is a monolithic integrated structure having isolated separate cells, then the voltage drop across the substrate resistors 9 (X−1)S, 9XS and 9 (X+1)S are characteristic for the xth cell. Rather than making direct measurements, voltage differences between the lands 8 (X−1)S, and 8XS, or between 8XS and 8 (X+1)S may be measured. The test process in accordance with the invention has been described in connection with transistor units, by way of example. It may, equally, be used with other semiconductor elements, such as diodes, thyristors, triacs, field effect devices such as field effect transistors, and other semiconductor elements. The number and the arrange-of the required measuring resistors will depend on the number, type and arrangement of the electrodes of the respective semiconductor units. In order to save surface area, under some conditions, some measuring resistors in some of the electrode connecting lines can be omitted if defects sensed by measuring across the respective test resistors will arise only with a low degree of probability.

Various changes and modifications may be made, and features described in connection with any one embodiment may be used with any of the other, within the scope of the invention.

We claim:

1. Composite semiconductor unit comprising on a common substrate:
   a plurality of substantially similar semiconductor elements each containing at least one p-n junction and having a plurality of electrodes, and
   circuit means in said unit for connecting the similar electrodes of all said elements, except those found to be defective as hereinafter stated, effectively in parallel through branches leading to said respective electrodes, all of said branches related to each set of similar electrodes being connected together by a common lead conductor path, said circuit means including, in each of said branches respectively related to the electrodes of at least one set of similar electrodes, means for facilitating detection of whether the semiconductor element connected to the branch in question is defective and means for facilitating severing of the branch, at least one branch so equiped related to each defective semiconductor element, if any, being severed at said severance facilitation means thereby to disconnect said defective element from the others.

2. Unit according to claim 1 wherein said defect detection facilitating means are in each case a resistance in series in the circuit branch in question.

3. Unit according to claim 1, wherein the resistance is an ohmic resistor.

4. Unit according to claim 3, wherein resistance is formed by the same semiconductor material as the associated electrode of the element.

5. Unit according to claim 3, wherein the resistance is formed by a random zone of semiconductor material of said unit.

6. Unit according to claim 3, wherein the resistance is formed by a metallic connecting strip forming a portion of the metallic connecting path of the branch of said circuit means of which the resistance forms a part 7. Unit according to claim 6, wherein said metallic connecting strip has a zone, the cross-sectional area of which is reduced with respect to the remainder of the connecting network.

8. Unit according to claim 6, wherein the metallic connecting strip comprises high resistance material.

9. Unit according to claim 8, wherein said high resistance material comprises a nickel-chrome alloy.

10. Unit according to claim 3, wherein the resistance comprises a parallel connection of at least two subresistors.

11. Unit according to claim 10, wherein at least one of the sub-resistors comprises at least one of: a random semiconductor region or zone on the unit; a portion of the metallic connecting network of the unit.

12. Unit according to claim 2, wherein the resistor is non-linear resistor.

13. Unit according to claim 12, wherein at least a portion of the resistor comprises a diode.

14. Unit according to claim 1, wherein said resistance is additional to resistors formed on said unit and is provided specifically as the means for facilitating detection of a defective element.

15. Unit according to claim 1, wherein the resistance comprises a balancing, or equalizing resistor formed on said unit to provide, simultaneously, for equalization of current distribution under normal operation of said unit and the means for facilitating detection of a defective element.

16. Unit according to claim 2, wherein said resistance comprises a resistance zone inherent in the structure of the respective cell, or element.

17. Unit according to claim 2, in combination with voltage sensing means (121) connected across a respective resistance, to measure voltage drop and, upon flow of leakage current due to defective condition of a respective cell or element, indicating excessive voltage drop, and hence a defective element.

18. Unit according to claim 6, in combination with externally applied electrical means for severing at least a metallic connecting strip of a single branch of said circuit means leading to a defective element.

19. United according to claim 6, wherein the metallic connecting strip of said branch comprises with respect to the remainder of the metallic connecting path of the branch, at least one of: a zone or region of reduced cross-sectional area; a different material; a high resistance material; a zone of nickel-chrome material.

20. Unit according to claim 18, wherein the severing means comprises means for applying a current pulse to the unit sufficient to sever the metallic connecting strip of a circuit branch in which excessive current has previously been found normally to flow due to defects within the respective element.

21. Unit according to claim 6, wherein the metallic connecting path having said portion provides a zone of increased electrical resistance to form said metallic strip portion serving as a measuring resistor, and, likewise, forms a zone of decreased thermal resistance to provide a fusible link, capable of being severed by a current pulse.

22. Unit according to claim 6, wherein said metallic connecting path also includes metallic contacting lands on each end of said strip portion providing probe terminal contacts for connection to a measuring probe.

23. Unit according to claim 22, wherein each element, has at least one land associated therewith and located in a branch circuit leading to at least one of the electrodes thereof and of sufficient size and extent to permit contacting with a measuring probe.

24. Unit according to claim 23, wherein the size of the respective land is sufficient to accept contacting of a probe applying a current pulse.

* * * * *